(12) United States Patent
Tian et al.

(10) Patent No.: US 10,763,300 B2
(45) Date of Patent: Sep. 1, 2020

(54) LIGHT EMITTING DIODE DEVICE, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Ting Tian, Beijing (CN); Ming Zhai, Beijing (CN); Dayong Zhou, Beijing (CN); Zhiqiang Fan, Beijing (CN); Shuqian Dou, Beijing (CN); Taesung Kang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/007,113

(22) Filed: Jun. 13, 2018

(65) Prior Publication Data
US 2019/0019839 A1   Jan. 17, 2019

(30) Foreign Application Priority Data
Jul. 14, 2017   (CN) .......................... 2017 1 0575434

(51) Int. Cl.
  *H01L 27/15*   (2006.01)
  *H01L 33/40*   (2010.01)
  (Continued)

(52) U.S. Cl.
  CPC .......... *H01L 27/15* (2013.01); *H01L 25/0655* (2013.01); *H01L 25/167* (2013.01);
  (Continued)

(58) Field of Classification Search
  CPC ... H01L 27/15; H01L 27/153; H01L 25/0655; H01L 25/167; H01L 33/405; H01L 2924/00; H01L 25/0756
  See application file for complete search history.

(56) References Cited

U.S. PATENT DOCUMENTS

2008/0211400 A1* 9/2008 Kim ...................... H01L 27/153
                                                                 313/506
2013/0277692 A1   10/2013 Chang et al.
(Continued)

FOREIGN PATENT DOCUMENTS

| CN | 101263610 A | 9/2008 |
|---|---|---|
| CN | 204118108 U | 1/2015 |

OTHER PUBLICATIONS

First Office Action for Chinese Patent Application No. 201710575434.8 dated Dec. 21, 2018.

*Primary Examiner* — Patricia D Reddington
(74) *Attorney, Agent, or Firm* — Calfee, Halter & Griswold LLP

(57) ABSTRACT

A light emitting diode device, an array substrate and a display device. The light emitting diode device includes a substrate, a first sub-light emitting unit disposed on the substrate, and a second sub-light emitting unit disposed on a side of the first sub-light emitting unit away from the substrate. The first sub-light emitting unit includes a first semiconductor layer of a first conductivity type, a first light emitting layer, and a second semiconductor layer of a second conductivity type which are each disposed successively in a direction away from the substrate. The second sub-light emitting unit includes the second semiconductor layer, a second light emitting layer, and a third semiconductor layer of the first conductivity type. Each layer is disposed suc-
(Continued)

cessively in the direction away from the substrate. The first conductivity type is different from the second conductivity type.

13 Claims, 2 Drawing Sheets

(51) Int. Cl.
*H01L 25/065* (2006.01)
*H01L 25/16* (2006.01)
H01L 33/62 (2010.01)
H01L 33/32 (2010.01)
H01L 25/075 (2006.01)

(52) U.S. Cl.
CPC .......... *H01L 27/153* (2013.01); *H01L 33/405* (2013.01); *H01L 25/0753* (2013.01); *H01L 25/0756* (2013.01); *H01L 33/32* (2013.01); *H01L 33/62* (2013.01); *H01L 2924/00* (2013.01)

(56) References Cited

U.S. PATENT DOCUMENTS

| | | | |
|---|---|---|---|
| 2015/0263233 A1* | 9/2015 | Miyoshi | H01L 33/42 257/76 |
| 2016/0163940 A1* | 6/2016 | Huang | H01L 33/62 257/89 |

* cited by examiner

LIGHT EMITTING DIODE DEVICE, ARRAY SUBSTRATE AND DISPLAY DEVICE

RELATED APPLICATION

The present application claims the benefit of Chinese Patent Application No. 201710575434.8, filed on Jul. 14, 2017, the entire disclosure of which is incorporated herein by reference.

FIELD

Embodiments of the present disclosure relate to a light emitting diode device, an array substrate and a display device.

BACKGROUND

With the continuous development of display technologies, light emitting diode (LED) displays have become a new research hotspot in the display technology field due to their advantages such as high brightness, bright colors, long service life, low power consumption, and the like. LED displays can be widely applied to large squares, commercial advertising, stadiums, information dissemination, news release applications, securities transactions, etc., and can meet the needs of different environments.

SUMMARY

An embodiment of the present disclosure provides a light emitting diode device, comprising: a substrate; a first sub-light emitting unit disposed on the substrate; and a second sub-light emitting unit disposed on a side of the first sub-light emitting unit away from the substrate. The first sub-light emitting unit comprises a first semiconductor layer of a first conductivity type, a first light emitting layer, and a second semiconductor layer of a second conductivity type which are disposed successively in a direction away from the substrate, the first conductivity type being different from the second conductivity type. The second sub-light emitting unit comprises the second semiconductor layer, a second light emitting layer, and a third semiconductor layer of the first conductivity type which are disposed successively in the direction away from the substrate.

According to some embodiments of the present disclosure, an orthographic projection of the second light emitting layer on the substrate at least partially overlaps an orthographic projection of the first light emitting layer on the substrate.

According to some embodiments of the present disclosure, the orthographic projection of the second light emitting layer on the substrate is located within the orthographic projection of the first light emitting layer on the substrate.

According to some embodiments of the present disclosure, the light emitting diode device further comprises a third sub-light emitting unit disposed on a side of the second sub-light emitting unit away from the substrate. The third sub-light emitting unit comprises the third semiconductor layer, a third light emitting layer, and a fourth semiconductor layer of the second conductivity type which are disposed successively in the direction away from the substrate.

According to some embodiments of the present disclosure, the first semiconductor layer includes a first overlapping region and a first exposed region, and the first light emitting layer and the second semiconductor layer are disposed in the first overlapping region. The second semiconductor layer includes a second overlapping region and a second exposed region, and the second light emitting layer and the third semiconductor layer are disposed in the second overlapping region. The light emitting diode device further comprises a first electrode, the first electrode being electrically connected to the first semiconductor layer and disposed in the first exposed region; a second electrode, the second electrode being electrically connected to the second semiconductor layer and disposed in the second exposed region; and a third electrode, the third electrode being electrically connected to the third semiconductor layer.

According to some embodiments of the present disclosure, the third electrode completely covers a surface of the third semiconductor layer away from the substrate.

According to some embodiments of the present disclosure, at least one of the first electrode, the second electrode and the third electrode includes a light reflective material.

According to some embodiments of the present disclosure, the first semiconductor layer includes a first overlapping region and a first exposed region, and the first light emitting layer and the second semiconductor layer are disposed in the first overlapping region. The second semiconductor layer includes a second overlapping region and a second exposed region, and the second light emitting layer and the third semiconductor layer are disposed in the second overlapping region. The third semiconductor layer includes a third overlapping region and a third exposed region, and the third light emitting layer and the fourth semiconductor layer are disposed in the third overlapping region. The light emitting diode device further comprises: a first electrode, the first electrode being electrically connected to the first semiconductor layer and disposed in the first exposed region; a second electrode, the second electrode being electrically connected to the second semiconductor layer and disposed in the second exposed region; a third electrode, the third electrode being electrically connected to the third semiconductor layer and disposed in the third exposed region; and a fourth electrode, the fourth electrode being electrically connected to the fourth semiconductor layer.

According to some embodiments of the present disclosure, the fourth electrode completely covers a surface of the fourth semiconductor layer away from the substrate.

According to some embodiments of the present disclosure, at least one of the first electrode, the second electrode, the third electrode and the fourth electrode comprises a light reflective material.

Another embodiment of the present disclosure provides an array substrate comprising: a base substrate; and a plurality of pixels disposed on the base substrate. Each pixel comprises a light emitting diode device. The light emitting diode device comprises a first sub-light emitting unit, and a second sub-light emitting unit disposed on a side of the first sub-light emitting unit close to the base substrate. The first sub-light emitting unit comprises a first semiconductor layer of a first conductivity type, a first light emitting layer, and a second semiconductor layer of a second conductivity type which are disposed successively in a direction towards the base substrate. The second sub-light emitting unit comprises the second semiconductor layer, a second light emitting layer, and a third semiconductor layer of the first conductivity type which are disposed successively in the direction towards the base substrate. The first conductivity type is different from the second conductivity type.

According to some embodiments of the present disclosure, in the array substrate, the light emitting diode device further comprises: a third sub-light emitting unit disposed on a side of the second sub-light emitting unit close to the base substrate. The third sub-light emitting unit comprises the third semiconductor layer, a third light emitting layer, and a fourth semiconductor layer of the second conductivity type which are disposed successively in the direction towards the base substrate.

According to some embodiments of the present disclosure, the first sub-light emitting unit and the second sub-light emitting unit are configured to emit light with different colors, and each pixel further comprises a monochromatic light emitting diode device configured to emit light with a different color from that of the first sub-light emitting unit and the second sub-light emitting unit.

According to some embodiments of the present disclosure, in the array substrate, the light emitting diode device further comprises a substrate, the substrate being disposed on a side of the light emitting diode device away from the base substrate.

According to some embodiments of the present disclosure, in the array substrate, the light emitting diode device further comprises: a first electrode, a second electrode, and a third electrode. The first electrode is configured to be electrically connected to the first semiconductor layer, the first semiconductor layer includes a first overlapping region and a first exposed region, the first light emitting layer and the second semiconductor layer are disposed in the first overlapping region, and the first electrode is disposed in the first exposed region. The second electrode is configured to be electrically connected to the second semiconductor layer, the second semiconductor layer includes a second overlapping region and a second exposed region, the second light emitting layer and the third semiconductor layer are disposed in the second overlapping region, the second electrode is disposed in the second exposed region, and the third electrode is configured to be electrically connected to the third semiconductor layer. The array substrate further comprises: a first contact electrode, the first contact electrode being disposed on a side of the base substrate close to the light emitting diode device and in contact with the first electrode; a second contact electrode, the second contact electrode being disposed on the side of the base substrate close to the light emitting diode device and in contact with the second electrode; and a third contact electrode, the third contact electrode being disposed on the side of the base substrate close to the light emitting diode device and in contact with the third electrode.

According to some embodiments of the present disclosure, in the array substrate, the light emitting diode device further comprises: a first electrode, a second electrode, a third electrode, and a fourth electrode. The first electrode is configured to be electrically connected to the first semiconductor layer, the first semiconductor layer includes a first overlapping region and a first exposed region, the first light emitting layer and the second semiconductor layer are disposed in the first overlapping region, and the first electrode is disposed in the first exposed region. The second electrode is configured to be electrically connected to the second semiconductor layer, the second semiconductor layer includes a second overlapping region and a second exposed region, the second light emitting layer and the third semiconductor layer are disposed in the second overlapping region, and the second electrode is disposed in the second exposed region. The third electrode is configured to be electrically connected to the third semiconductor layer, the third semiconductor layer includes a third overlapping region and a third exposed region, the third to light emitting layer and the fourth semiconductor layer are disposed in the third overlapping region, and the third electrode is disposed in the third exposed region. The fourth electrode is configured to be electrically connected to the fourth semiconductor layer. The array substrate further comprises: a first contact electrode, the first contact electrode being disposed on a side of the base substrate close to the light emitting diode device and in contact with the first electrode; a second contact electrode, the second contact electrode being disposed on the side of the base substrate close to the light emitting diode device and in contact with the second electrode; a third contact electrode, the third contact electrode being disposed on the side of the base substrate close to the light emitting diode device and in contact with the third electrode; and a fourth contact electrode, the fourth contact electrode being disposed on the side of the base substrate close to the light emitting diode device and in contact with the fourth electrode.

A further embodiment of the present disclosure provides a display device comprising any of the array substrates described above.

BRIEF DESCRIPTION OF DRAWINGS

In order to more clearly illustrate the technical solutions of embodiments of the present disclosure, the drawings of the embodiments will be briefly described below. It is apparent that the drawings in the description below merely relate to some embodiments of the present disclosure and do not limit the present disclosure.

DETAILED DESCRIPTION

Figure 1:
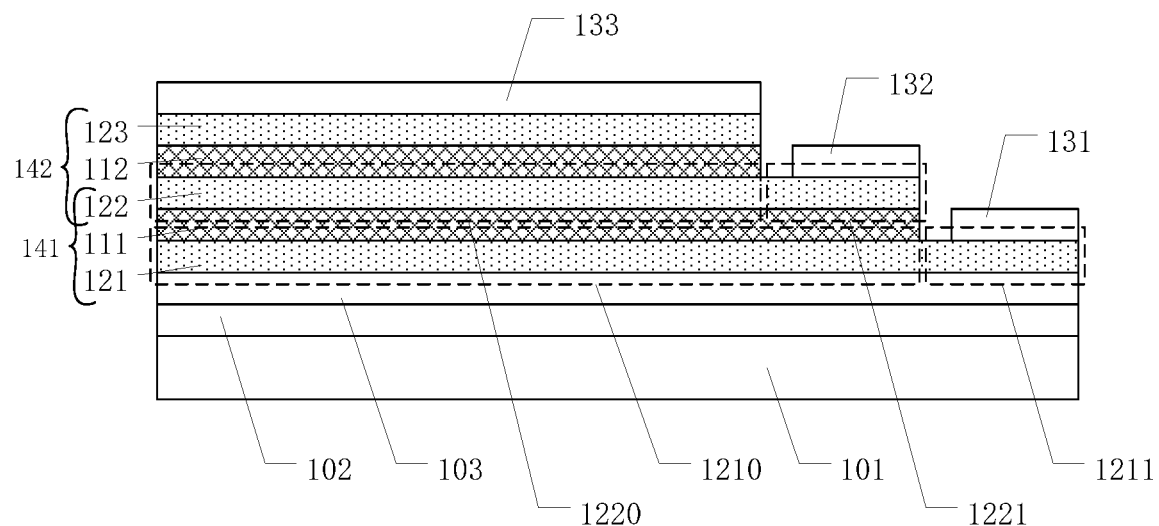
FIG. 1 is a schematic structural diagram of a light emitting diode device provided by an embodiment of the present disclosure.

To make the objectives, technical solutions, and advantages of embodiments of the present disclosure clearer, the technical solutions of the embodiments of the present disclosure will be described below in a clear and complete manner with reference to the accompanying drawings. Obviously, the described embodiments are part of the embodiments of the present disclosure, but not all of the embodiments. All other embodiments obtained by those ordinarily skilled in the art based on the described embodiments of the present disclosure without spending inventive efforts shall fall within the protection scope of the present disclosure.

Unless defined otherwise, technical terms or scientific terms used in the present disclosure have common meanings as understood by those ordinarily skilled in the art to which the present disclosure pertains. The words "first", "second", and the like used in the present disclosure do not denote any order, quantity, or importance, but rather merely serve to distinguish between different components. The word "including" or "comprising" and the like mean that the presence of an element or item preceding the word encompasses elements or items listed after the word and their equivalents, without excluding other elements or items. The word "connect" or "connecting" and the like are not limited to physical or mechanical connections, but may include electrical connections, regardless of being direct or indirect.

Light emitting diode (LED) displays have advantages such as high brightness, bright colors, long service life, low power consumption, and the like. However, with the constant pursuit of high resolution, conventional LED displays cannot meet the demand for high resolution. In addition, sub-pixels in a conventional full-color LED display need to be individually diced and then placed at corresponding positions on a base substrate with a vacuum suction nozzle for attachment. As a result, production efficiency of a conventional LED display is relatively low while production cost thereof is relatively high.

Therefore, embodiments of the present disclosure provide an improved light emitting diode device, an array substrate, and a display device. The light emitting diode device comprises a substrate, a first sub-light emitting unit disposed on the substrate, and a second sub-light emitting unit disposed on a side of the first sub-light emitting unit away from the substrate. The first sub-light emitting unit comprises a first semiconductor layer of a first conductivity type, a first light emitting layer, and a second semiconductor layer of a second conductivity type which are disposed successively in a direction away from the substrate. The second sub-light emitting unit comprises the second semiconductor layer of the second conductivity type as described above, a second light emitting layer, and a third semiconductor layer of the first conductivity type which are disposed successively in the direction away from the substrate, wherein the first conductivity type is different from the second conductivity type. Thus, the light emitting diode device can effectively reduce area occupied by each pixel, so that the resolution of a display device that employs the light emitting diode device can be improved. In addition, since the light emitting diode device can be equivalent to two monochromatic light emitting diode devices, the production efficiency of the light emitting diode device is relatively high while the production cost thereof is relatively low.

Hereinafter, a light emitting diode device, an array substrate, and a display device provided by embodiments of the present disclosure will be described with reference to the accompanying drawings.

At least one embodiment of the present disclosure provides a light emitting diode device. FIG. 1 shows a light emitting diode device according to this embodiment. As shown in FIG. 1, the light emitting diode device comprises a substrate 101, a first sub-light emitting unit 141, and a second sub-light emitting unit 142. The first sub-light emitting unit 141 is disposed on the substrate 101, and the second sub-light emitting unit 142 is disposed on a side of the first sub-light emitting unit 141 away from the substrate 101. The first sub-light emitting unit 141 comprises a first semiconductor layer 121 of a first conductivity type, a first light emitting layer 111, and a second semiconductor layer 122 of a second conductivity type which are disposed successively in a direction away from the substrate 101. The second sub-light emitting unit 142 comprises the second semiconductor layer 122 of the second conductivity type, a second light emitting layer 112, and a third semiconductor layer 123 of the first conductivity type which are disposed successively in the direction away from the substrate 101. The first sub-light emitting unit 141 and the second sub-light emitting unit 142 share the second semiconductor layer 122 of the second conductivity type as described above.

In the above light emitting diode device provided by this embodiment, the first sub-light emitting unit and the second sub-light emitting unit may emit light of different colors simultaneously. For example, the first sub-light emitting unit may emit blue light, and the second sub-light emitting unit may emit green light. Thus, by controlling luminous intensities of the first sub-light emitting unit and the second sub-light emitting unit, it is possible to enable the light emitting diode device to emit mixed light of two colors. Moreover, the luminous intensities of the first sub-light emitting unit and the second sub-light emitting unit can be independently controlled, thus the light emitting diode device can function as two monochromatic light emitting diode devices. When the light emitting diode device is applied to an LED display device, area occupied by each pixel can be reduced, so that the resolution of the LED display device can be improved. For example, when the first sub-light emitting unit of the light emitting diode device provided by this embodiment emits blue light, and the second sub-light emitting unit emits green light, a red light-emitting monochromatic light emitting diode device may be additionally provided, which constitutes one pixel with the light emitting diode device provided by this embodiment to realize full-color display. Compared to a pixel constituted by three monochromatic light emitting diode devices, it is apparent that the area occupied by a pixel of the LED display device that employs the light emitting diode device provided by this embodiment is reduced. In addition, since the light emitting diode device can be equivalent to two monochromatic light emitting diode devices, the production efficiency of the light emitting diode device is relatively high while the production cost thereof is relatively low.

It is to be noted that the first sub-light emitting unit and the second sub-light emitting unit in the light emitting diode device of this embodiment may also emit light of the same color, thereby improving the color purity or brightness of the light emitted from the light emitting diode device. In such cases, each pixel may or may not comprise an additional monochromatic light emitting diode device. When the additional monochromatic light emitting diode device is comprised, it emits light of the same color as the light emitted by the first sub-light emitting unit and the second sub-light emitting unit.

For example, the first conductivity type may be an n-type doped with a first impurity, and correspondingly, the second conductivity type may be a p-type doped with a second impurity; or the first conductivity type may be a p-type doped with a second impurity, and correspondingly, the second conductivity type may be an n-type doped with a first impurity. For example, the first impurity is a donor impurity and the second impurity is an acceptor impurity. Depending on the semiconductor material used, the first impurity and the second impurity may be different elements. For a GaN semiconductor, for example, the first impurity may be a silicon (Si) element and the second impurity may be a magnesium (Mg) element.

In an exemplary embodiment, materials of the substrate 101 may include sapphire, silicon, silicon carbide, or the like. Of course, the substrate may also be made of a material such as gallium arsenide (GaAs), lithium aluminate (LiAlO$_2$), aluminum nitride (AlN), gallium nitride (GaN), or the like. Alternatively, the substrate may also be various epitaxial wafers, etc. No limitation is made in this regard to this embodiment.

In an exemplary embodiment, the materials of the first semiconductor layer 121, the second semiconductor layer 122, and the third semiconductor layer 123 may be a gallium nitride-based semiconductor material such as gallium nitride (GaN), indium gallium nitride (InGaN), or aluminum indium gallium nitride (AlInGaN).

In an exemplary embodiment, the first light emitting layer 111 may be a quantum well emitting light of blue wave band, and the second light emitting layer 112 may be a quantum well emitting light of green wave band. Alternatively, the first light emitting layer 111 may be a quantum well emitting light of green wave band, and the second light emitting layer 112 may be a quantum well emitting light of blue light wave band. The materials of the quantum well may include indium gallium nitride (InGaN) or aluminum indium gallium nitride (AlInGaN).

In some examples, as shown in FIG. 1, an orthographic projection of the second light emitting layer 112 on the substrate 101 at least partially overlaps an orthographic projection of the first light emitting layer 111 on the substrate 101. In particular, the orthographic projection of the second light emitting layer 112 on the substrate 101 may be located within the orthographic projection of the first light emitting layer 111 on the substrate 101. In this manner, the area occupied by the light emitting diode device can be reduced.

In some examples, as shown in FIG. 1, the first semiconductor layer 121 includes a first overlapping region 1210 and a first exposed region 1211, and the first light emitting layer 111 and the second semiconductor layer 122 are disposed on the first overlapping region 1210. The second semiconductor layer 122 includes a second overlapping region 1220 and a second exposed region 1221, and the second light emitting layer 112 and the third semiconductor layer 123 are disposed on the second overlapping region 1220. In this case, the light emitting diode device further comprises a first electrode 131, a second electrode 132, and a third electrode 133. The first electrode 131 is disposed on the first exposed region 1211 and is electrically connected to the first semiconductor layer 121, thereby applying a voltage to the first semiconductor layer 121. The second to electrode 132 is disposed on the second exposed region 1221 and is electrically connected to the second semiconductor layer 122, thereby applying a voltage to the second semiconductor layer 122. The third electrode 133 is electrically connected to the third semiconductor layer 123, thereby applying a voltage to the third semiconductor layer 123. Thus, the first light emitting layer 111 may emit light under the co-drive of the voltage or current on the first electrode 131 and the voltage or current on the second electrode 132, and the luminous intensity of the first light emitting layer 111 can be controlled by controlling the magnitude of the voltage or current on the first electrode 131 and/or the magnitude of the voltage or current on the second electrode 132. The second light emitting layer 112 may emit light under the co-drive of the voltage or current on the second electrode 132 and the voltage or current on the third electrode 133, and the luminous intensity of the second light emitting layer 112 can be controlled by controlling the magnitude of the voltage or current on the second electrode 132 and/or the magnitude of the voltage or current on the third electrode 133.

In some examples, the third electrode 133 completely covers a surface of the third semiconductor layer 123 far from the substrate 101, and the material of at least one of the first electrode 131, the second electrode 132, and the third electrode 133 may include, in exemplary embodiments, a light reflective material. In this manner, the first electrode 131, the second electrode 132, and the third electrode 133 may reflect light emitted by the first sub-light emitting unit 141 and the second sub-light emitting unit 142 towards the substrate 101, respectively, thereby avoiding light loss of the light emitting diode device.

In some examples, as shown in FIG. 1, the light emitting diode device further comprises a first buffer layer 102 and, in certain exemplary embodiments, a second buffer layer 103. The first buffer layer 102 is disposed on a side of the first semiconductor layer 121 close to the substrate 101. The second buffer layer 103 is disposed between the first buffer layer 102 and the first semiconductor layer 121.

In an exemplary embodiment, the material of the first buffer layer 102 and the second buffer layer 103 is a transparent material. The first buffer layer 102 and the second buffer layer 103 may be a low-temperature nucleation layer formed of aluminum nitride (AlN), gallium nitride (GaN), or the like. In particular, the first buffer layer 102 may be, for example, a low-temperature GaN layer. The second buffer layer 103 may be, for example, an undoped GaN layer. The first buffer layer 102 and the second buffer layer 103 can alleviate the lattice mismatch between the substrate 101 and a light emitting stack of the first sub-light emitting unit 141, reduce crystal defects resulting from the lattice mismatch, decrease the dislocation density, and increase the quality of the light emitting stack, and can also prevent cracking of the light emitting stack during cooling.

It is to be noted that, if the substrate 101 has a lattice constant close to that of the first semiconductor layer 121, the first buffer layer 102 and the second buffer layer 103 may not be provided. For example, if the material of the substrate 101 is GaN and the material of the first semiconductor layer 121 is doped GaN, the GaN substrate is a homogeneous substrate and can avoid the stress, defects or cracking resulting from the lattice mismatch and thermal expansion mismatch, thus the buffer layers may not be disposed.

In an exemplary embodiment, the first buffer layer 102 and the second buffer layer 103 may be formed by deposition such as metal organic chemical vapor deposition (MOCVD), hydride vapor phase epitaxy (HYPE) method, molecular beam epitaxy (MBE), metal organic vapor phase epitaxy (MOVPE), halide chemical vapor deposition (HCVD) or the like.

Figure 2:
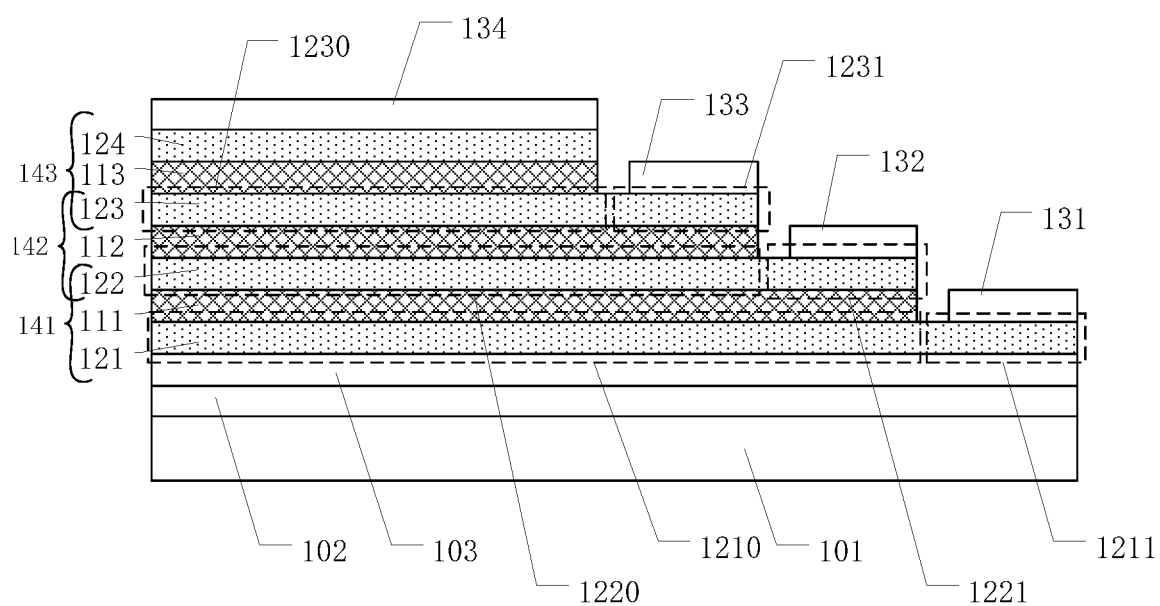
FIG. 2 is a schematic structural diagram of another light emitting diode device provided by an embodiment of the present disclosure.

FIG. 2 shows another light emitting diode device according to this embodiment. As shown in FIG. 2, the light emitting diode device further comprises a third sub-light emitting unit 143. The third sub-light emitting unit 143 is disposed on a side of the second sub-light emitting unit 142 away from the substrate 101, and comprise the third semiconductor layer 123 of the first conductivity type, a third light emitting 113, and a fourth semiconductor layer 124 of the second conductivity type which are disposed successively in the direction away from the substrate 101. The second sub-light emitting unit 142 and the third sub-light emitting unit 143 share the third semiconductor layer 123 of the first conductivity type as described above. In the light emitting diode device, the first sub-light emitting unit, the second sub-light emitting unit, and the third sub-light emitting unit may emit light of different colors simultaneously. For example, the first sub-light emitting unit may emit blue light, the second sub-light emitting unit may emit green light, and the third sub-light emitting unit may emit red light. Thus, the light emitting diode device can emit light of three different colors simultaneously, and the luminous intensities of the first sub-light emitting unit, the second sub-light emitting unit, and the third sub-light emitting unit can be independently controlled, thus the light emitting diode device can function as three monochromatic light emitting diode devices. When the light emitting diode device is applied to an LED display device, the area occupied by each pixel can be further reduced, so that the resolution of the LED display device can be improved. For example, when the first sub-light emitting unit of the light emitting diode device provided by this embodiment emits blue light, the second sub-light emitting unit thereof emits green light, and the third sub-light emitting unit thereof emits red light, one pixel can be constituted to realize full-color display. Compared to a pixel constituted by three monochromatic light emitting diode devices, it is apparent that the area occupied by a pixel of the LED display device that employs the light emitting diode device provided by this embodiment is greatly reduced. In addition, since the light emitting diode device can be equivalent to three monochromatic light emitting diode devices, the production efficiency of the light emitting diode device is relatively high while the production cost thereof is relatively low.

Of course, as those skilled in the art will appreciate, the first sub-light emitting unit, the second sub-light emitting unit, and the third sub-light emitting unit of the light emitting diode device of this embodiment may also emit light of the same color, thereby improving the color purity or brightness of the light emitted from the light emitting diode device.

In some examples, as shown in FIG. 2, the first semiconductor layer 121 includes a first overlapping region 1210 and a first exposed region 1211, and the first light emitting layer 111 and the second semiconductor layer 122 are disposed on the first overlapping region 1210. The second semiconductor layer 122 includes a second overlapping region 1220 and a second exposed region 1221, and the second light emitting layer 112 and the third semiconductor layer 1230 are disposed on the second overlapping region 1220. The third semiconductor layer 123 includes a third overlapping region 1230 and a third exposed region 1231, and the third light emitting layer 113 and the fourth semiconductor layer 124 are disposed on the third overlapping region 1230. At that time, the light emitting diode device further comprises a first electrode 131, a second electrode 132, a third electrode 133, and a fourth electrode 134. The first electrode 131 is disposed on the first exposed region 1211 and is electrically connected to the first semiconductor layer 121, thereby applying a voltage to the first semiconductor layer 121. The second electrode 132 is disposed on the second exposed region 1221 and is electrically connected to the second semiconductor layer 122, thereby applying a voltage to the second semiconductor layer 122. The third electrode 133 is electrically connected to the third semiconductor layer 123 and is disposed on the third exposed region 1231, thereby applying a voltage to the third semiconductor layer 123. The fourth electrode 134 is electrically connected to the fourth semiconductor layer 124, thereby applying a voltage to the fourth semiconductor layer 124. Thus, the first light emitting layer 111 may emit light under the co-drive of the voltage or current on the first electrode 131 and the voltage or current on the second electrode 132, and the luminous intensity of the first light emitting layer 111 can be controlled by controlling the magnitude of the voltage or current on the first electrode 131 and/or the magnitude of the voltage or current on the second electrode 132. The second light emitting layer 112 may emit light under the co-drive of the voltage or current on the second electrode 132 and the voltage or current on the third electrode 133, and the luminous intensity of the second light emitting layer 112 can be controlled by controlling the magnitude of the voltage or current on the second electrode 132 and/or the magnitude of the voltage or current on the third electrode 133. The third light emitting layer 113 may emit light under the co-drive of the voltage or current on the third electrode 133 and the voltage or current on the fourth electrode 134, and the luminous intensity of the third light emitting layer 113 can be controlled by controlling the magnitude of the voltage or current on the third electrode 133 and/or the magnitude of the voltage or current on the fourth electrode 134.

In some examples, the fourth electrode 134 completely covers a surface of the fourth semiconductor layer 124 away from the substrate 101, and the material of the fourth electrode 134 may include, in exemplary embodiments, a light reflective material. In this manner, the fourth electrode 134 may reflect light emitted from the first sub-light emitting unit 141, the second sub-light emitting unit 142, and the third sub-light emitting unit 143 towards the substrate 101, thereby reducing light loss of the light emitting diode device.

Figure 3:
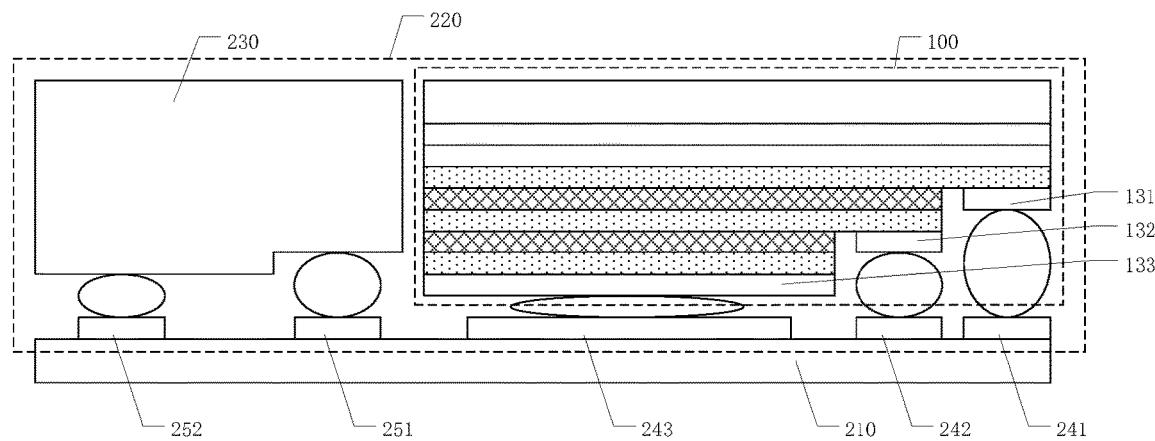
FIG. 3 is a schematic structural diagram of an array substrate provided by an embodiment of the present disclosure.

At least one embodiment of the present disclosure further provides an array substrate. FIG. 3 shows an array substrate according to the present embodiment. As shown in FIG. 3, the array substrate comprises a base substrate 210 and a pixel 220 disposed on the base substrate 210. The pixel 220 includes a light emitting diode device 100 described in any one of the foregoing embodiments.

In some examples, the light emitting diode device 100 may employ the structure illustrated in FIG. 1, comprising a substrate 101, a first sub-light emitting unit 141, and a second sub-light emitting unit 142. The first sub-light emitting unit 141 is disposed on the substrate 101, and the second sub-light emitting unit 142 is disposed on a side of the first sub-light emitting unit 141 away from the substrate 101. The first sub-light emitting unit 141 comprises a first semiconductor layer 121 of a first conductivity type, a first light emitting layer 111, and a second to semiconductor layer 122 of a second conductivity type, which are disposed successively. The second sub-light emitting unit 142 comprises the second semiconductor layer 122 of the second conductivity type as described above, a second light emitting layer 112, and a third semiconductor layer 123 of the first conductivity type. The first sub-light emitting unit 141 and is the second sub-light emitting unit 142 share the second semiconductor layer 122 of the second conductivity type as described above.

In the array substrate provided by this embodiment, the first sub-light emitting unit and the second sub-light emitting unit may emit light of different colors simultaneously. For example, the first sub-light emitting unit emits blue light, and the second sub-light emitting unit emits green light. Thus, by controlling the luminous intensities of the first sub-light emitting unit and the second sub-light emitting unit, it is possible to enable the light emitting diode device to emit mixed light of two colors. Moreover, the luminous intensities of the first sub-light emitting unit and the second sub-light emitting unit can be independently controlled, thus the light emitting diode device can function as two monochromatic light emitting diode devices. Therefore, the array substrate can reduce the area occupied by each pixel, so that the resolution of an LED display device that employs the array substrate can be improved. In addition, since the light emitting diode device can be equivalent to two monochromatic light emitting diode devices, the production efficiency of the array substrate is relatively high while the production cost thereof is relatively low.

In an exemplary embodiment, the substrate 101 may be removed after the light emitting diode device 100 is mounted on the base substrate 210 in the form of flip-chip. In this case, the light emitting diode device comprises a first sub-light emitting unit and a second sub-light emitting unit disposed on a side of the first sub-light emitting unit close to the base substrate. The first sub-light emitting unit comprises a first semiconductor layer of a first conductivity type, a first light emitting layer, and a second semiconductor layer of a second conductivity type, which are disposed successively in a direction towards the base substrate, and the second sub-light emitting unit comprises the second semiconductor layer of the second conductivity type as described above, a second light emitting layer, and a third semiconductor layer of the first conductivity type which are disposed successively in the direction towards the base substrate.

The base substrate 210 may be a transparent insulating base substrate or a metal base substrate. Examples of the transparent insulating base substrate may include a glass base substrate, a quartz base substrate, a ceramic base substrate, or other suitable base substrates. The metal base substrate may include, for example, a copper-based copper clad laminate, an aluminum-based copper clad laminate, an iron-based copper clad laminate, or the like.

In some examples, the first sub-light emitting unit and the second sub-light emitting unit are configured emit light of different colors, and the pixel 220 further includes a monochromatic light emitting diode device 230 that is configured to emit light of a different color from that of the first sub-light emitting unit and the second sub-light emitting unit. For example, when the first sub-light emitting unit of the light emitting diode device 100 emits blue light, and the second sub-light emitting unit thereof emits green light, a red light-emitting monochromatic light emitting diode device 230 may be additionally provided, which constitutes one pixel 220 with the light emitting diode device 100 to realize full-color display.

In some examples, the light emitting diode device 100 is disposed on the base substrate 210 in a flip-chip manner. That is, the substrate of the light emitting diode device 100 is disposed on a side of the light emitting diode device 100 away from the base substrate 210. For example, the above flip-chip manner may be flip-chip soldering, eutectic soldering, ultrasonic thermal compression welding, conductive adhesive bonding, or other soldering techniques. The flip-chip soldering may employ, for example, a bump soldering technique.

In some examples, the first semiconductor layer of the light emitting diode device 100 includes a first overlapping region and a first exposed region, and the first light emitting layer and the second semiconductor layer are disposed in the first overlapping region. The second semiconductor layer includes a second overlapping region and a second exposed region, and the second light emitting layer and the third semiconductor layer are disposed in the second overlapping region. The light emitting diode device further comprises a first electrode, a second electrode, and a third electrode. The first electrode is disposed in the first exposed region and is electrically connected to the first semiconductor layer, thereby applying a voltage to the first semiconductor layer. The second electrode is disposed in the second exposed region and is electrically connected to the second semiconductor layer, thereby applying a voltage to the second semiconductor layer. The third electrode is electrically connected to the third semiconductor layer, thereby applying a voltage to the third semiconductor layer. For the specific structure, reference may be made to the light emitting diode device shown in FIG. 1. At that time, as shown in FIG. 3, the array substrate further comprises a first contact electrode 241, a second contact electrode 242, and a third contact electrode 243. The first contact electrode 241 is disposed on a side of the base substrate 210 close to the light emitting diode device 100 and in contact with the first electrode 131. The second contact electrode 242 is disposed on a side of the base substrate 210 close to the light emitting diode device 100 and in contact with the second electrode 132. The third contact electrode 243 is disposed on a side of the base substrate 210 close to the light emitting diode device 100 and in contact with the third electrode 133. For example, the first contact electrode 241 may be in contact with the first electrode 131 through an electric conductor, the second contact electrode 242 may be in contact with the second electrode 132 through an electric conductor, and the third contact electrode 243 may be in contact with the third electrode 133 through an electric conductor. Thus, the light emitting diode device can be driven by the first contact electrode, the second contact electrode, and the third contact electrode disposed on the base substrate.

For example, the material of the electrical conductor may include metals such as silver, gold, copper, and the like.

Of course, embodiments of the present disclosure include but are not limited to the above situation. For example, the first contact electrode 241 may be disposed in contact with the first electrode 131 through a conductive bump, the second contact electrode 242 may be disposed in contact with the second electrode 132 through a conductive bump, and the third contact electrode 243 may also be disposed in contact with the third electrode 133 through a conductive bump.

In some examples, as shown in FIG. 3, the array substrate further comprises a fifth contact electrode 251 and a sixth contact electrode 252, which are connected to a monochromatic light emitting diode device 230 respectively to drive the monochromatic light emitting diode device 230 to emit light.

Figure 4:
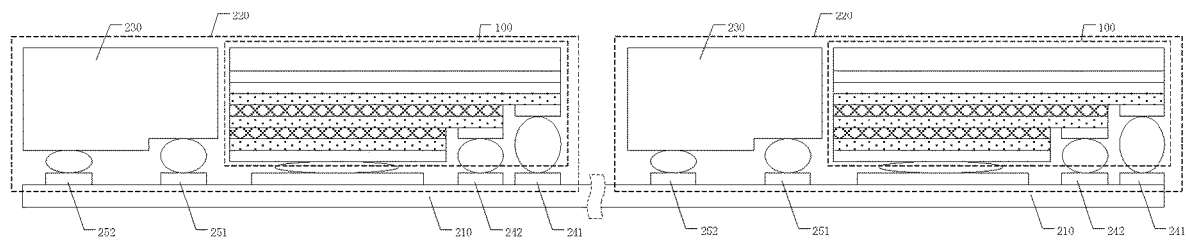
FIG. 4 is a schematic structural diagram of another array substrate provided by an embodiment of the present disclosure.

FIG. 4 shows another array substrate according to this embodiment. As shown in FIG. 4, the array substrate includes a plurality of pixels 220, and the pixel 220 includes the light emitting diode device 100 shown in FIG. 1 and the monochromatic light emitting diode device 230.

As those skilled in the art will appreciate, although FIGS. 3 and 4 exemplarily illustrate an array substrate including a specific number of pixels 220, this is merely illustrative. The array substrate according to embodiments of the present disclosure may include any number of pixels 220 according to actual needs.

Figure 5:
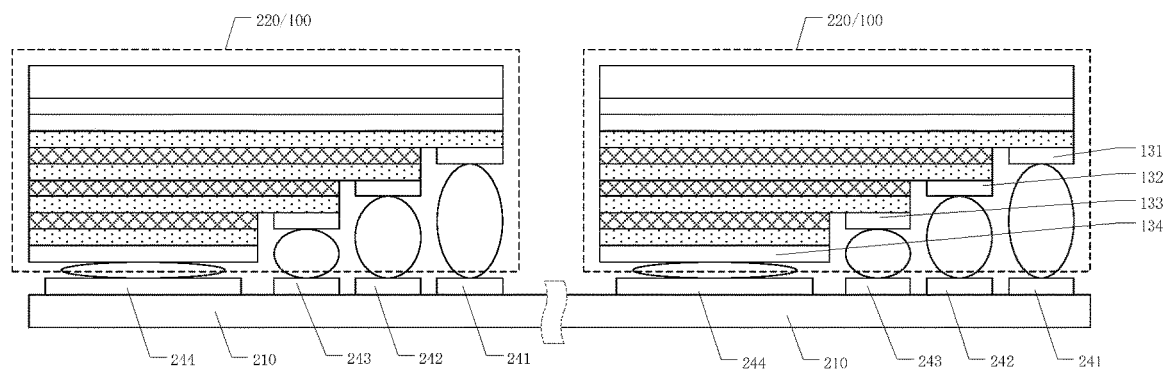
FIG. 5 is a schematic structural diagram of another array substrate provided by an embodiment of the present disclosure.

FIG. 5 shows another array substrate according to this embodiment. As shown in FIG. 5, the light emitting diode device 100 may employ the structure shown in FIG. 2, comprising a substrate, a first sub-light emitting unit, a second sub-light emitting unit, and a third sub-light emitting unit. The first sub-light emitting unit is disposed on the substrate, and the second sub-light emitting unit is disposed on a side of the first sub-light emitting unit away from the substrate. The first sub-light emitting unit comprises a first semiconductor layer of a first conductivity type, a first light emitting layer, and a second semiconductor layer of a second conductivity type which are disposed successively in a direction away from the substrate. The second sub-light emitting unit comprises the second semiconductor layer of the second conductivity type as described above, a second light emitting layer, and a third semiconductor layer of the first conductivity type which are disposed successively in the direction away from the substrate. The first sub-light emitting unit and the second sub-light emitting unit share the second semiconductor layer of the second conductivity type as described above. The third sub-light emitting unit is disposed on a side of the second sub-light emitting unit away from the substrate. The third sub-light emitting unit comprises the third semiconductor layer of the first conductivity type as described above, a third light emitting layer, and a fourth semiconductor layer of the second conductivity type which are disposed successively in a direction away from the substrate. The second sub-light emitting unit and the third sub-light emitting unit share the third semiconductor layer of the first conductivity type as described above. Refer to the relevant description of FIG. 2 for details.

In the array substrate, the first sub-light emitting unit, the second sub-light emitting unit, and the third sub-light emitting unit may emit light of different colors simultaneously. For example, the first sub-light emitting unit may emit blue light, the second sub-light emitting unit may emit green light, and the third sub-light emitting unit may emit red light. Thus, by controlling the luminous intensities of the first sub-light emitting unit, the second sub-light emitting unit and the third sub-light emitting unit, it is possible to enable the light emitting diode device to emit mixed light of three colors and realize full-color display. Moreover, the luminous intensities of the first sub-light emitting unit, the second sub-light emitting unit, and the third sub-light emitting unit can be independently controlled, thus the light emitting diode device can function as three monochromatic light emitting diode devices. At that time, when the array substrate is applied to an LED display device, the area occupied by each pixel can be further reduced, so that the resolution of the LED display device can be improved. In addition, since the light emitting diode device can be equivalent to three monochromatic light emitting diode devices, the production efficiency of the array substrate is relatively high while the production cost thereof is relatively low.

In an exemplary embodiment, the substrate 101 may be removed after the light emitting diode device 100 is mounted on the base substrate 210 in a flip-chip manner. That is, the light emitting diode device further comprises a third sub-light emitting unit disposed on a side of the second sub-light emitting unit close the base substrate, and the third sub-light emitting unit comprises a third semiconductor layer, a third light emitting layer, and a fourth semiconductor layer of the second conductivity type which are disposed successively a direction towards the base substrate.

In some examples, the light emitting diode device further comprises: a first electrode, a second electrode, a third electrode, and a fourth electrode. The first electrode is configured to be electrically connected to the first semiconductor layer. The first semiconductor layer includes a first overlapping region and a first exposed region. The first light emitting layer and the second semiconductor layer are disposed in the first overlapping region, and the first electrode is disposed in the first exposed region. The second electrode is configured to be electrically connected to the second semiconductor layer. The second semiconductor layer includes a second overlapping region and a second exposed region. The second light emitting layer and the third semiconductor layer are disposed in the second overlapping region, and the second electrode is disposed in the second exposed region. The third electrode is configured to be electrically connected to the third semiconductor layer. The third semiconductor layer includes a third overlapping region and a third exposed region. The third light emitting layer and the fourth semiconductor layer are disposed in the third overlapping region, and the third electrode is disposed in the third exposed region. The fourth electrode is configured to be electrically connected to the fourth semiconductor layer. At that time, as shown in FIG. 5, the array substrate further comprises a first contact electrode 241, a second contact electrode 242, a third contact electrode 243, and a fourth contact electrode 244. The first contact electrode 241 is disposed on a side of the base substrate 210 close to the light emitting diode device 100 and in contact with the first electrode 131. The second contact electrode 242 is disposed on a side of the base substrate 210 close to the light emitting diode device 100 and in contact with the second electrode 132. The third contact electrode 243 is disposed on a side of the base substrate 210 close to the light emitting diode device 100 and in contact with the third electrode 133. The fourth contact electrode 244 is disposed on a side of the base substrate 210 close to the light emitting diode device 100 and in contact with the fourth electrode 134. For example, the first contact electrode 241 may be in contact with the first electrode 131 through an electrical conductor, the second contact electrode 242 may be in contact with the second electrode 132 through an electrical conductor, the third contact electrode 243 may be in contact with the third electrode 133 through an electrical conductor, and the fourth contact electrode 244 may be in contact with the fourth electrode 134 through an electrical conductor. Thus, the light emitting diode device can be driven by the first contact electrode, the second contact electrode, the third contact electrode, and the fourth contact electrode disposed on the base substrate.

At least one embodiment of the present disclosure further provides a display device. The display device comprises any of the array substrates described above. Since the display device employs a light emitting diode device having a first sub-light emitting unit and a second sub-light emitting unit that can emit light simultaneously, or a light emitting diode device having a first sub-light emitting unit, a second sub-light emitting unit, and a third sub-light emitting unit that can emit light simultaneously, the area occupied by each pixel in the display device can be reduced, so that the resolution of the display device can be improved. In addition, since the light emitting diode device can be equivalent to two or three monochromatic light emitting diode devices, the production efficiency of the display device is relatively high while the production cost thereof is relatively low.

For example, the display device of this embodiment may be applied to any product or component having a display function such as a television, a digital camera, a mobile phone, a watch, a tablet computer, a notebook computer, a navigator, and the like. For another example, the LED device of this embodiment may also be applied to landscape decoration, outdoor display screens, advertisement demonstration boards, signage indication, or illumination.

It is to be noted that, in the drawings of the embodiments of the present disclosure, only the structures related to the embodiments of the present disclosure are involved, and other structures may refer to normal designs. Besides, it is to be further noted that the features in the same embodiment and different embodiments of the present disclosure can be combined with each other in the case of causing no conflict.

What have been stated above are only specific embodiments of the present disclosure, but the scope of the present disclosure is not so limited. Variations or replacements that can be easily conceived by any skilled person familiar with this technical field within the technical scope revealed by the present disclosure shall be encompassed within the scope of the present disclosure. Thus, the protection scope of the present disclosure shall be based on the scope of the appended claims.

The invention claimed is:

1. An array substrate comprising:
a base substrate; and
a plurality of pixels disposed on the base substrate, wherein each pixel comprises a light emitting diode device,
wherein the light emitting diode device comprises a first sub-light emitting unit, and a second sub-light emitting unit disposed on a side of the first sub-light emitting unit close to the base substrate,
wherein the first sub-light emitting unit comprises:
a first semiconductor layer of a first conductivity type,
a first light emitting layer, and
a second semiconductor layer of a second conductivity type;
wherein each layer of the first sub-light emitting unit is disposed successively in a direction towards the base substrate;
wherein the second sub-light emitting unit comprises:
the second semiconductor layer,
a second light emitting layer, and
a third semiconductor layer of the first conductivity type;
wherein the layers of the second sub-light emitting unit are each disposed successively in the direction towards the base substrate, and
wherein the first conductivity type being different from the second conductivity type,
wherein the light emitting diode device further comprises:
a first electrode,
a second electrode, and
a third electrode,
wherein the first electrode is configured to be electrically connected to the first semiconductor layer,
wherein the first semiconductor layer includes a first overlapping region and a first exposed region, the first light emitting layer and the second semiconductor layer being disposed in the first overlapping region,
wherein the first electrode is disposed in the first exposed region,
wherein the second electrode is configured to be electrically connected to the second semiconductor layer, the second semiconductor layer including a second overlapping region and a second exposed region, the second light emitting layer and the third semiconductor layer being disposed in the second overlapping region,
wherein the second electrode is disposed in the second exposed region,
wherein the third electrode is configured to be electrically connected to the third semiconductor layer, and
the array substrate further comprises:
a first contact electrode, the first contact electrode being directly on the base substrate, disposed on a side of the base substrate close to the light emitting diode device, and in contact with the first electrode;
a second contact electrode, the second contact electrode being directly on the base substrate, disposed on the side of the base substrate close to the light emitting diode device, and in contact with the second electrode; and
a third contact electrode, the third contact electrode being directly on the base substrate, disposed on the side of the base substrate close to the light emitting diode device, and in contact with the third electrode.

2. The array substrate according to claim 1, wherein the light emitting diode device further comprises:
a third sub-light emitting unit disposed on a side of the second sub-light emitting unit close to the base substrate,
wherein the third sub-light emitting unit comprises:
the third semiconductor layer,
a third light emitting layer, and
a fourth semiconductor layer of the second conductivity type;
wherein each layer in the third sub-light emitting unit is disposed successively in the direction towards the base substrate.

3. The array substrate according to claim 1, wherein the first sub-light emitting unit and the second sub-light emitting unit are configured to emit light of different colors, and each pixel comprises a monochromatic light emitting diode device that is configured to emit light of a different color from that of the first sub-light emitting unit and the second sub-light emitting unit.

4. The array substrate according to claim 1, wherein the light emitting diode device further comprises a substrate, the substrate being disposed on a side of the light emitting diode device away from the base substrate.

5. The array substrate according to claim 2, wherein the light emitting diode device further comprises:
a fourth electrode,
wherein the fourth electrode is configured to be electrically connected to the fourth semiconductor layer; and
the array substrate further comprises:
a fourth contact electrode, the fourth contact electrode being disposed on the side of the base substrate close to the light emitting diode device and in contact with the fourth electrode.

6. The array substrate according to claim 1, wherein the third electrode completely covers a surface of the third semiconductor layer away from the substrate.

7. The array substrate according to claim 1, wherein at least one of the first electrode, the second electrode or the third electrode includes a light reflective material.

8. A display device comprising an array substrate, the array substrate comprising a base substrate, and a plurality of pixels disposed on the base substrate,
wherein each pixel comprises a light emitting diode device,
wherein the light emitting diode device comprises a first sub-light emitting unit, and a second sub-light emitting unit disposed on a side of the first sub-light emitting unit close to the base substrate,
wherein the first sub-light emitting unit comprises:
a first semiconductor layer of a first conductivity type,
a first light emitting layer, and
a second semiconductor layer of a second conductivity type;
wherein each layer of the first sub-light emitting unit is disposed successively in a direction towards the base substrate,
wherein the second sub-light emitting unit comprises:
the second semiconductor layer,
a second light emitting layer, and
a third semiconductor layer of the first conductivity type;
wherein each layer of the second sub-light emitting unit is disposed successively in the direction towards the base substrate; and
wherein the first conductivity type being different from the second conductivity type,
wherein the light emitting diode device further comprises:
a first electrode,
a second electrode, and
a third electrode,
wherein the first electrode is configured to be electrically connected to the first semiconductor layer,
wherein the first semiconductor layer includes a first overlapping region and a first exposed region, the first light emitting layer and the second semiconductor layer being disposed in the first overlapping region, wherein the first electrode is disposed in the first exposed region, wherein the second electrode is configured to be electrically connected to the second semiconductor layer, the second semiconductor layer including a second overlapping region and a second exposed region, the second light emitting layer and the third semiconductor layer being disposed in the second overlapping region, wherein the second electrode is disposed in the second exposed region, wherein the third electrode is configured to be electrically connected to the third semiconductor layer, and the array substrate further comprises:

a first contact electrode, the first contact electrode being directly on the base substrate, disposed on a side of the base substrate close to the light emitting diode device, and in contact with the first electrode;

a second contact electrode, the second contact electrode being directly on the base substrate, disposed on the side of the base substrate close to the light emitting diode device, and in contact with the second electrode; and a third contact electrode, the third contact electrode being directly on the base substrate, disposed on the side of the base substrate close to the light emitting diode device, and in contact with the third electrode.

9. The display device according to claim 8, wherein an orthographic projection of the second light emitting layer on the base substrate at least partially overlaps an orthographic projection of the first light emitting layer on the base substrate.

10. The display device according to claim 9, wherein the orthographic projection of the second light emitting layer on the base substrate is located within the orthographic projection of the first light emitting layer on the base substrate.

11. The display device according to claim 8, wherein the light emitting diode device further comprises:

a third sub-light emitting unit disposed on a side of the second sub-light emitting unit close to the base substrate, wherein the third sub-light emitting unit comprises:
the third semiconductor layer,
a third light emitting layer, and
a fourth semiconductor layer of the second conductivity type;

wherein each layer of the third sub-light emitting unit is disposed successively in a direction towards the base substrate.

12. The display device according to claim 8, wherein the third electrode completely covers a surface of the third semiconductor layer away from the substrate.

13. The display device according to claim 8, wherein at least one of the first electrode, the second electrode or the third electrode includes a light reflective material.

* * * * *

UNITED STATES PATENT AND TRADEMARK OFFICE
CERTIFICATE OF CORRECTION

PATENT NO. : 10,763,300 B2  
APPLICATION NO. : 16/007113  
DATED : September 1, 2020  
INVENTOR(S) : Ting Tian et al.

Page 1 of 1

It is certified that error appears in the above-identified patent and that said Letters Patent is hereby corrected as shown below:

On the Title Page

Please add the following Assignee in item (73):  
BEIJING BOE OPTOELECTRONICS TECHNOLOGY CO., LTD.  
NO. 8, XIHUANZHONGLU, BDA  
BEIJING, CHINA 100176

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*